THERMOELECTRIC SYSTEM

Filed May 6, 1964

Inventor:
Alwin B. Newton
By: Thomas B. Hunter Atty.

United States Patent Office 3,255,593

Patented June 14, 1966

3,255,593

THERMOELECTRIC SYSTEM

Alwin B. Newton, York, Pa., assignor to Borg-Warner Corporation, Chicago, Ill., a corporation of Illinois Filed May 6, 1964, Ser. No. 365,401

11 Claims. (Cl. 62—3)

Figure 1:
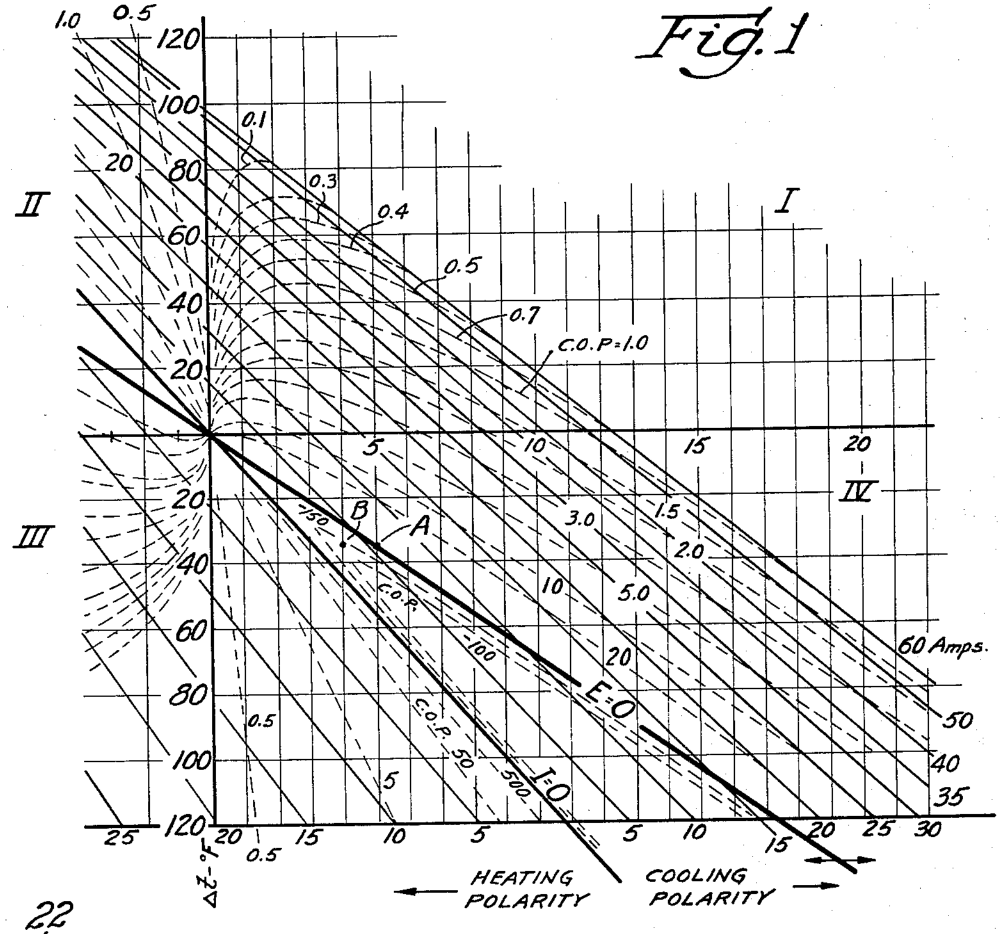

This invention relates to improvements in thermoelectric systems adapted for heating or cooling and especially those incorporated into air-conditioning units.

In an apparatus of the aforementioned type, the functions of heating and cooling are selectively interchangeable by merely reversing the D.C. current supply to the thermoelectric module in the air-conditioning unit. In other words, when cooling is required, heat is abstracted from the space to be cooled and rejected to a heat sink which is cooled by some secondary cooling medium such as cooling tower water or ambient air. When heating is required, the direction of the current supplied to the thermoelectric modules is reversed so that heat is abstracted at the junction which was formerly the sink and rejected to the air circulating within the space to be heated.

In certain applications, such as, for example, the control of temperature within an environment where a considerable amount of heat is generated by machinery or electronic apparatus, there may be a substantially constant load on the air-conditioning system. Under these conditions, cooling may be required within the controlled space even when the outside ambient temperature is below the temperature desired within said space.

Cooling may also be required, under the aforementioned conditions, within buildings having large glass areas exposed to the sun, although the air-conditioning load would normally fluctuate over a wider range.

The present invention is primarily concerned with operation of the thermoelectric air-conditioning units under circumstances when the ambient or sink temperature is lower than the temperature within the controlled space. Advantage is taken of the fact that thermoelectric elements will not only function as reversible heat pumps when electrical energy is supplied, but will also operate as generators of electrical energy when the opposed junctions are maintained at different temperatures. Briefly stated, the invention resides in modifying the circuit under these conditions by discontinuing the power input and, at the same time, connecting a resistance load in series with the thermoelectric elements. The thermoelectric elements will then be functioning as electrical generating means and the heat generated within the load may then be employed usefully in some other location where heating is required, or dissipated to the sink.

It is therefore a principal object of the present invention to provide an improved thermoelectric system which increases the efficiency of operations when the outside ambient or sink temperatures are lower than those required for comfort within the controlled environment.

It is another object of the invention to provide a system which takes advantage of the "free" cooling provided by operating the thermoelectric elements as electrical generating means.

It is another object of the invention to provide a method of operating a thermoelectric system within the region where the thermoelectric modules themselves supply the power for the heat pumping effect.

Figure 2:
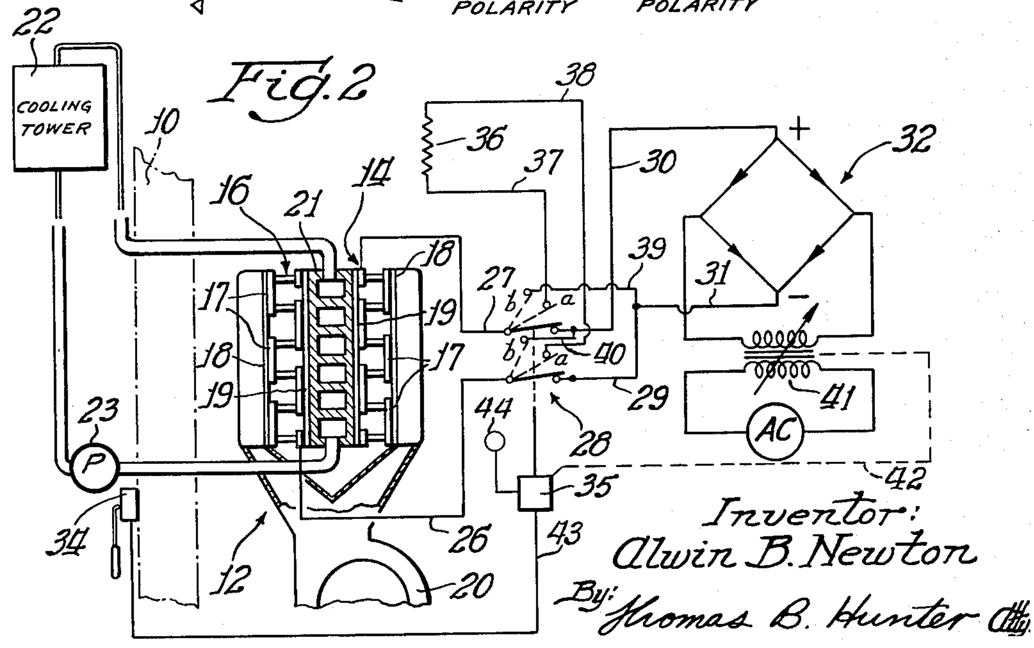

Other objects and advantages of the invention will be apparent from a reading of the following detailed description taken in conjunction with the drawings wherein:

FIGURE 1 is a typical performance chart for a thermoelectric couple or module; and FIGURE 2 is a schematic or diagrammatic representation of a thermoelectric air-conditioning system embodying the principles of the invention.

Before describing the specific nature of the invention, it would be advisable to review certain basic principles of thermoelectric heat pumping. For purposes of this disclosure there are two equations of special interest:

$$Q_c = \pi_c I - \tfrac{1}{2} I^2 R - K(T_o - T_i) \quad (1)$$

where $Q_c$=Heat abstracted at the cold junction per unit time. (Assuming the system is cooling, the outside junction is normally the hot junction and the inside junction is normally the cold junction.)

$\pi_c$=The Peltier coefficient.

$I$=Current flow.

$R$=Resistance of the thermoelectric material.

$K$=Coefficient of thermal conductivity of the thermoelectric material.

$T_o$=Temperature of outside junction.

$T_i$=Temperature of inside junction.

$$I = \frac{E - S(T_o - T_i)}{R} \quad (2)$$

where:

$I$=Current flow.

$E$=Input voltage to module.

$R$=Resistance.

$S$=Seebeck coefficient of the thermoelectric material.

$T_i$=Temperature of inside junction.

$T_o$=Temperature of outside junction.

The Peltier coefficient, $\pi_c$, the resistance R, and the coefficient of thermal conductivity are all characteristics of the particular thermoelectric material used and may be regarded as constants within a given range of operation. The term "$\pi_c I$" of Equation 1 is the pumping function and is, in effect, the sole determining factor of the magnitude and direction of the heat pumped by the Peltier thermoelectric phenomenon. The terms $\tfrac{1}{2}I^2R$ and $K(T_o - T_i)$ are power losses, the first being an effect of resistance heating of the thermoelectric material and the second being the conducted heat flow from the hot junction to the cold junction through the material.

Equation 2 represents the current, I, as a function of both the applied voltage, E, and the E.M.F. generated by the thermo-couple due to the Seebeck effect. The latter term is commonly applied to the phenomenon which results when two junctions of a thermo-couple circuit are maintained at different temperatures, said temperature difference establishing a potential difference between the junctions and a corresponding current flow through the circuit. The term $S(T_o - T_i)$ indicates that the Seebeck E.M.F. is proportional to the temperature difference between the hot and cold junctions.

Referring now to FIGURE 1, which, as noted above, is a representative performance chart for a typical thermoelectric couple or module, the vertical scale on the performance chart represents the temperature differential between the two junctions of said couple. The slanting lines each represent a constant D.C. current and the curved (dashed) lines each follow a constant coefficient of performance, i.e. the ratio of the cooling effect produced to the power input required. The particular performance chart of FIGURE 1 illustrates the variables involved for a system having a constant sink temperature of 40° F. It should be understood that if the sink temperature changes, a different chart would have to be used. However, for purposes of this disclosure, a 40° F. sink temperature chart is useful for explaining the mode of operation of the invention. Since this type of chart is made up for the operation of a particular thermoelectric module design, it is pointed out that the thermoelectric module used for the chart had an area of 38.2 square mm. and an $A/L$ ratio of 1.27 cm.

In the upper right-hand quadrant, designated as quadrant I, the temperature of the inside or load side junction is colder than the outside or sink junction. As indicated by the positive values of $Q_c$ along the abscissa, heat is being abstracted from the cold junction and rejected at the hot or sink junction. In the lower right-hand quadrant, designated as quadrant IV, the sink or outside junction is colder than the inside or load side junction as indicated by the negative $\Delta T$ values. The direction of heat pumping in both of these quadrants is from the inside junction to the outside junction. The other two quadrants on the left-hand side of the vertical axis, namely quadrants II and III, are of no interest insofar as this particular disclosure is concerned; consequently, no specific reference will be made thereto.

During operation of the unit in the region of quadrant IV, it is obvious that the portion of the total heat transfer is due to the thermoelectric pumping effect and part is due to the conduction of heat through the thermoelectric material. This can be confirmed by reference back to Equation 1. The term $K(T_o-T_i)$ is negative in quadrant IV because the temperature of the inside junction is greater than the temperature of the outside junction.

Insofar as Equation 2 is concerned, in quadrant I the applied voltage E is opposed by the Seebeck E.M.F. generated by the thermoelectric module. Since the term $S(T_o-T_i)$ is positive, for any given voltage input, the current is diminished by increases in $\Delta T$. In quadrant IV, however, the applied voltage E and the Seebeck E.M.F. are additive because what was the hot junction in quadrant I is now the cold junction and vice versa. Consequently, the term $S(T_o-T_i)$ is negative and increases in the absolute values of $\Delta T$ (downwardly on the $\Delta T$ axis) result in an increase of the current through the thermoelectric module.

With reference to the performance chart, it will be noted that there are two lines intersecting the origin, identified as $E=0$ and $I=0$. Operation of the system anywhere to the right of the $I=0$ line will pump heat thermoelectrically from the inside junction to the outside junction even though the net transfer of heat may be in the opposite direction (quadrant II). In other words, as long as the pumping factor $\pi_c I$ (Equation 1) is positive, the heat pumping due to the Peltier effect will be positive even though the losses due to $I^2R$ heating and conductive heat transfer, $K\Delta T$ exceed the effect of Peltier heat pumping. Conversely, operations in the region to the left of $I=0$ are characterized by Peltier heat pumping from the outside junction to the inside junction. In quadrant IV, for example, there is a wedge-shaped area to the right of the vertical axis and to the left of $I=0$ where the heating losses are greater than the thermoelectrically transferred heat.

All points on the line designated as $E=0$ represent the current flow when the input voltage across the module is zero. It should be understood that this line represents a system only in which the resistance of the circuit is fixed. The slope of this line, incidentally, also represents the value of the Seebeck coefficient S divided by R. Referring back to Equation 2, when $E=0$, $I=S\Delta T/R$. Between the lines $I=0$ and $E=0$, the current generated by the module due to the Seebeck effect is sufficient to maintain heat pumping operations within this region. If the input voltage E is equal to zero, the current can be further reduced by increasing the resistance within the circuit. Along the line $I=0$, there is no Peltier heat pumping; as a result, all the heat transfer is due to conduction from the hot side (inside) junction to the cold side (outside) junction. In other words, the slope of the $I=0$ line is equal to the coefficient of thermal conductivity, K, for the thermoelectric material.

As pointed out in the preliminary remarks, it is an object of the invention to permit the thermoelectric modules to function as electrical generating means during operations within the region between the lines $I=0$ and $E=0$. To provide a simplified example of the operation of the system, it will be assumed that there is a constant air-conditioning load. It will be further assumed that initially the system is operating at a somewhat higher sink temperature, say 90° F., and somewhere in a corresponding quadrant I of a performance chart (not shown), illustrating the variables for a 90° F. sink temperature. Later, it will be assumed that the sink temperature drops to 40° F., due to a change in atmospheric conditions, or some other reason. As the sink temperature drops, the required heat pumping load can be accommodated by gradually reducing the power supplied to the modules. As the power is reduced, the temperature difference between the hot side and the cold side decreases to the point where they are equal; then operation passes into quadrant IV where the inside junction is warmer than the outside junction. At this point, heat will flow from the former to the latter by conduction alone, but the power supplied to the module augments the conductive heat transfer and results in better control.

Eventually, operation of the system may pass well into quadrant IV and reach the $E=0$ line. At this point, the procedure contemplated by the present invention is to connect a resistance load across the circuit of the region between the $E=0$ and $I=0$ lines. During this phase of operations, the thermoelectric module is generating electricity by means of the Seebeck effect and liberating it through $I^2R$ heating at the resistance load.

Referring to FIGURE 1, it will be assumed that there is a substantially constant cooling load on the system requiring that about 5 B.t.u.'s per hour per couple be removed from the controlled space. As the voltage input to the modules gradually decreases, it eventually reaches the $E=0$ line, at which time the current supplied by means of the Seebeck effect is approximately 6 amps. This point is designated at A on the chart. If a resistance load is inserted into the circuit and, at the same time, the power supply cut out of the system, the increased resistance will move the point of operations to the left from point A to point B. Operations can then be continued within this region indefinitely, taking advantage of the free cooling effect of the system and liberating heat at the resistance load. Point B corresponds to a current of approximately 2.5 amps, and a $\Delta T$ of 35° F. This means that the sink side is at 40° F. and the inside junction is approximately 75° F. For optimum efficiency, the value of the resistance connected across the modules should be approximately the same value of the resistance of the modules.

It should be understood that the terms "inside junction," "outside junction," "sink side," "load side," etc. are to be interpreted within the particular reference framework of the operating system. For example, when referring to the outside junction, the description does not imply that said junction is physically located outside the controlled space; it merely denotes that it is thermally associated with ambient conditions to which heat is either rejected or abstracted depending on whether the system is cooling or heating. Similarly, while the term "sink" is commonly used to refer to the means for absorbing and dissipating the heat rejected, for purposes of this disclosure, the sink is always associated with outside ambient, regardless of whether the unit is used for heating or cooling.

The basic principles of the present invention having been described, a preferred embodiment of a system for putting these principles to practical use will now be outlined. Referring to FIGURE 2, reference numeral 10 denotes the wall of a building or other enclosure, said wall dividing the controlled space from outside ambient. Disposed within the space to be cooled (or heated) is an air-conditioning unit 12 comprising thermoelectric means which include a pair of opposed panels 14 and 16, each of which comprises a plurality of thermoelectric modules 17 connected in an electrical circuit. The modules 17 are arranged so that they have common junctions 18, 19 referred to hereinafter as the load side and the sink side respectively. The load side 18 of each module panel is preferably provided with fins over which air is circulated by means of a fan 20. The sink side 19 of each thermoelectric module panel is mounted in heat transfer relation on a heat exchanger 21 through which a secondary heat exchange fluid is circulated. In the embodiment illustrated, water from a cooling tower 22 is circulated by means of a pump 23 through a plurality of channels in said heat exchanger, but it should be understood that any conventional means for removing the heat rejected at the sink side may be employed. This particular air conditioning system is described in more detail in copending application, Ser. No. 229,945, filed October 11, 1962.

The circuit for energizing the thermoelectric modules includes means for reversing the direction of current supplied to the modules and for cutting off the power supply while simultaneously introducing a resistance load across the thermoelectric circuit. The modules, including alternately arranged P and N type materials, are adapted to be connected in series with a D.C. power supply indicated generally at 32. Conductors 26, 27 connect the module assembly to a double pole-three position switch 28, which, in response to a controller 35, is operative to selectively connect the module assembly to the power supply in a reversible manner, i.e., so that the current can be reversed, or connect it in series with the resistance 36. In one position of switch 28 (shown in solid lines), current is supplied in one direction through conductors 26, 27, 29, 30, and 31. In the dotted line position of the switch designated *a*, the resistance 36 is connected across conductors 26, 27 through conductors 37, 38. When switch 28 is in the dotted line position designated *b*, the direction of current supplied to connectors 26, 27 is reversed. Current is carried, in series, through conductors 30, 40, and 26 to the modules and back to the power supply through conductors 27, 39, and 41.

The controller 35 for actuating switch 28 also controls the variable transformer 41 associated with the power supply, through a control line indicated schematically by dotted line 42, in response to outside ambient temperature as sensed by temperature responsive element 34 which is interconnected to controller 35 through line 43. As described in the aforementioned Ser. No. 229,945, the level of the power available to the thermoelectric units is in proportion to the load as indicated by an outside temperature sensing element sensing ambient air or, alternatively the sink side heat exchange medium being circulated through the cooling tower 22. When the outside ambient temperature is very high, maximum power is available to the thermoelectric units for cooling purposes. As the temperature drops, the power level supplied to the thermoelectric modules decreases to permit them to be operated for longer periods of time. As the ambient temperature drops still further, the thermoelectric units are switched from cooling to heating and the power level increases again so as to enable the thermoelectric units to provide sufficient heating. An indoor thermostat 44 responsive to the temperature within the enclosed space controls the supply of electrical energy to the thermoelectric unit in response to the desired temperature within the enclosure and governs whether the unit is operating in the cooling or heating mode. The outdoor thermostat 34, which may either sense ambient air temperature or the temperature of the sink heat exchange fluid being circulated to the thermoelectric units, is adapted to move the switch 32 to dotted line position *a* whenever the power level available to the thermoelectric units is zero. Obviously, this can be done in several different ways, such as by the temperature difference or by means responsive to the output of the variable transformer 41. In any event, the control means should indicate that operations can be carried out in the self-generation region between $E=0$ and $I=0$. The actual control system for such a unit may take several forms and is described herein only in terms of its overall function. Reference may be made to Ser. No. 229,945 for the details of this control system.

Switch 28 is coupled to controller 35 and is operative to switch to its current reversing position *b* when the outside ambient temperature falls below the predetermined temperature at which the resistance 36 is cut in. This is for the purpose of maintaining very precise control of the temperature when the load drops below the "self-generation" range. In other words, the controller 35 which operates variable transformer 41 can be also used as a means for determining the point on the loading curve to initiate the movement of switch 28. When the "outside" voltage impressed across the modules drops to zero, i.e. at any point on the line $E=0$, switch 28 will move to position *a* and operation will be conducted in the self-generation region between $E=0$ and $I=0$. If the control system calls for slowing down the rate of conductive heat transfer by moving to a point along the line $I=0$, switch 28 will then shift to position *b* and supply unidirectional current to the module in the opposite direction. Referring back to FIGURE 1, when operations are to the left of line $I=0$ (but to the right of the Y-axis), the current is reversed to oppose or hold back the conductive heat transfer. In other words, while the direction of net heat transfer is out of the building, the Peltier heat pumping is into the building during operations within the aforementioned area on the performance chart.

While this invention has been described in connection with a certain specific embodiment thereof, it is to be understood that this is by way of illustration and not by way of limitation; and the scope of this invention is defined solely by the appended claims which should be construed as broadly as the prior art will permit.

I claim:

1. A method of operating a thermoelectric system of the type including a plurality of thermoelectric modules and a D.C. power supply under conditions when the conductive heat transfer through the thermoelectric modules from the hot junction to the cold junction is sufficient to accommodate a given cooling load including the steps of:
- cutting off the D.C. power supply to the modules; and
- connecting a resistance across said modules to provide a closed circuit with said resistance and said modules connected in series.

2. A method as defined in claim 1 wherein the value of said resistance is substantially equal to the resistance of said modules.

3. A method of operating an air-conditioning system of the type including thermoelectric means, said thermoelectric means having a first junction thermally associated with a controlled space and a second junction thermally associated with a heat sink comprising the steps of:
- supplying D.C. current to said thermoelectric means to effect a transfer of heat from said first junction to said second junction when the temperature of said heat sink is above a predetermined temperature;
- discontinuing the current supply to said thermoelectric means when the temperature of said second junction is below said predetermined temperature; and
- introducing a resistance load across said thermoelectric means to provide a closed circuit whereby said thermoelectric means generates power required for its continued operation.

4. A thermoelectric system adapted for use in an air-conditioning apparatus comprising:
- a plurality of thermoelectric modules having a common first junction and a common second junction;
- means for supplying electrical energy to said modules so that heat is abstracted at the first junction and rejected at said second junction;

means for gradually decreasing the voltage of said electrical energy supplied to said modules as electrical energy required to accommodate the air-conditioning load decreases; and means for connecting a resistance across said thermoelectric modules when the input voltage to said modules is in the neighborhood of zero whereby said modules generate the current required for their continued operation by means of the Seebeck effect.

5. A method of operating a thermoelectric air-conditioning system of the type including a plurality of thermoelectric modules and a D.C. power supply comprising the steps of:

supplying current to said thermoelectric modules to effect transfer of heat from the load side to the sink side of said modules during conditions when the temperature of the sink is above a predetermined temperature;

decreasing the voltage input to the thermoelectric modules as the temperature differential between the sink and the load side of said modules decreases; and discontinuing the voltage input when the sink temperature is below said predetermined temperature and simultaneously introducing an electrical resistance across at least some of said modules whereby the modules function as electrical generating means.

6. A method of operating a thermoelectric air-conditioning system of the type including a plurality of thermoelectric modules and a D.C. power supply comprising the steps of:

applying a voltage across the thermoelectric modules to augment the conductive transfer of heat from the load side to the sink side of said modules during conditions when the temperature of the sink is below the temperature desired in the controlled environment; and discontinuing the voltage input when the sink temperature is below a predetermined temperature, said predetermined temperature being appreciably below the load side temperature; and introducing an electrical resistance load, said resistance having a value substantially equal to the resistance of the thermoelectric modules, in series connection with said modules whereby the modules function as electrical generating means which continue to abstract heat from the controlled space and liberate it at the load and the sink.

7. In a thermoelectric system, the combination comprising:

a series of thermoelectric modules having a sink side and a load side;

means for passing a heat exchange medium in heat exchange relation with the sink side of said modules;

means for passing a flow of air to be conditioned in heat exchange relation with the load side of said modules;

power supply means for supplying a D.C. current to said thermoelectric modules;

temperature responsive means responsive to the temperature of the heat exchange fluid passing in contact with the sink side of said modules; and means actuated by said temperature responsive means for discontinuing the D.C. current from said power supply means and for introducing an electrical resistance in series with said thermoelectric modules in a closed circuit.

8. The system as defined in claim 7 wherein said temperature responsive means is responsive to the outside ambient temperature and wherein the temperature of said heat exchange fluid is a function of said outside ambient temperature.

9. In a thermoelectric air-conditioning system for cooling an enclosed space subject to a variable air-conditioning load, said system being of the type including a series of thermoelectric modules each having a sink side and a load side, power supply means for supplying a D.C. voltage input to said modules, and means for passing a heat exchange fluid in heat exchange relation with the sink side of said modules, the magnitude of said air-conditioning load imposed on said enclosed space varying in accordance with the temperature of said heat exchange fluid, the improvement comprising:

means responsive to said temperature of said heat exchange fluid for discontinuing the power supply and imposing a resistance load in series with said modules when said temperature is below a determined value.

10. Apparatus as defined in claim 9 wherein said resistance load is equal to the internal resistance of said thermoelectric modules.

11. A thermoelectric air-conditioning system comprising:

a plurality of thermoelectric modules each having a sink side and a load side;

means for circulating air to be conditioned in heat exchange relation with said load side;

means for passing a secondary heat exchange fluid in heat exchange relation with said sink side, the temperature of said secondary heat exchange fluid being a function of outside ambient temperature;

D.C. power supply means;

electrical resistance means;

switching mechanism for selectively connecting said thermoelectric modules (1) to said power supply so that current flows in a first direction, or (2) to said power supply so that current flows in the opposite direction, or (3) to said electrical resistance means;

temperature responsive means responsive to outside ambient temperature; and a controller operated by said temperature responsive means for actuating said switching mechanism.

References Cited by the Examiner

UNITED STATES PATENTS

| | | | |
|---|---|---|---|
| 2,881,594 | 4/1959 | Hopkins | 62—3 |
| 2,886,618 | 5/1959 | Goldsmid | 62—3 |
| 3,074,242 | 1/1963 | Lindenblad | 62—3 |

WILLIAM J. WYE, *Primary Examiner.*